United States Patent
Koo et al.

(10) Patent No.: US 6,201,746 B1
(45) Date of Patent: Mar. 13, 2001

(54) TEST METHOD FOR HIGH SPEED MEMORY DEVICES IN WHICH LIMIT CONDITIONS FOR THE CLOCK ARE DEFINED

(75) Inventors: Ja-hyun Koo; Jong-bok Tcho, both of Cheonan; Hyun-seop Shim, Incheon; Jeong-ho Bang, Cheonan, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/107,947

(22) Filed: Jun. 30, 1998

(30) Foreign Application Priority Data

Jun. 30, 1997 (KR) .................................................. 97-29711

(51) Int. Cl.$^7$ ...................................................... G11C 7/00
(52) U.S. Cl. ............................................ 365/201; 714/700
(58) Field of Search ............................ 365/201, 189.07, 365/193, 194, 233; 714/700

(56) References Cited

U.S. PATENT DOCUMENTS

| | | | |
|---|---|---|---|
| 3,976,940 | * 8/1976 | Chau et al. ........................... | 714/700 |
| 4,929,888 | * 5/1990 | Yoshida ................................ | 714/700 |
| 5,809,034 | * 9/1998 | Rezvani et al. ....................... | 714/700 |

* cited by examiner

Primary Examiner—Trong Phan
(74) Attorney, Agent, or Firm—Marger Johnson & McCollom, P.C.

(57) ABSTRACT

When high speed memory devices are tested using a tester having a lower operating frequency than the operational speed of the memory device, limit conditions for the tester signals are required to prevent the interference between the tester and device signals. The present invention provides the limit conditions for the shift and strobe signal. The strobe signal is delivered to comparators with a delivery delay time defining the dead time zone. The shift signal controls the data path of the device to and from a driver and a comparator. When the strobe signal is within the present test cycle, the shift signal of a read cycle must be activated at the same time or earlier than the activation time of the WE/ signal of the next write cycle and the shift signal of a write cycle must start at the same time or earlier than the activation time of the OE/ signal of the next read cycle. When the strobe signal is outside of the test cycle, the shift signal must meet prescribed maximum and minimum timing conditions.

20 Claims, 5 Drawing Sheets

TEST METHOD FOR HIGH SPEED MEMORY DEVICES IN WHICH LIMIT CONDITIONS FOR THE CLOCK ARE DEFINED

BACKGROUND OF THE INVENTION

1. Field of the Invention

The present invention relates to a test method for testing semiconductor memory devices. More particularly, the present invention is directed to method of testing high speed memory devices using a relatively slow tester by defining the timing conditions of tester signals thereby preventing interferences with memory device signals.

2. Description of the Related Arts

In order to improve the operating speed of memory devices, a fast page (FP) mode and an extended data out (EDO) mode, also referred to as hyper page mode, are used in Dynamic Random Access Memory (DRAM) devices.

FIG. 1 is a timing diagram of the conventional DRAM operating in the FP mode. In the FP mode, the DRAM allows faster data operations within a page boundary defined by a valid row address being available at the falling edge of the Row Address Strobe (RAS/) signal. This is accomplished by holding the RAS/ signal low and toggling the Column Address Strobe (CAS/) signal so that a plurality of memory cells connected to the same row are sequentially selected by valid column addresses at subsequent falling edges of the CAS/ signal. Data operations for one page end when both the RAS/ and the CAS/ signals change from an active logic low state to an inactive logic high state.

The Write Enable (WE/) signal is used to select between read and write operations in the DRAM. When the WE/ signal is at a logic high, the DRAM reads out data. The access time from the RAS/ signal $t_{RAC}$ is defined as the time between the falling edge of the RAS/ signal and the time when the first data output is valid. The access time from the CAS/ signal $t_{CAC}$ is defined as the time between the falling edge of the CAS/ signal and the time when the first data output is valid. The access time from the column address $t_{AA}$ is time between the input of a valid column address and the time when the first data output is valid. These time parameters bound the operational speed of the DRAM. The cycle time of the FP mode $t_{PC}$ is measured from a first transition of the CAS/ signal from a logic low state to a logic high state to a second transition of the CAS/ signal from a logic low to a logic high state in a single page. The CAS/ signal precharge time $t_{CP}$ indicates when the CAS/ signal is in its inactive precharge state. Generally, the shorter the FP mode cycle time $t_{PC}$ and the shorter the CAS/ precharge time $t_{CP}$, the faster data is outputted from the DRAM. Therefore, the operational speed of the DRAM can also be defined by $t_{PC}$ and $t_{CP}$ time parameters.

FIG. 2 is a timing diagram of a conventional DRAM operating in the EDO mode. In the EDO mode, the DRAM operates similarly to the FP mode DRAM but at a faster cycle rate. The faster cycle rate is accomplished by deactivating the CAS/ signal by transitioning the CAS/ signal from a logic low to a logic high state. Deactivating the CAS/ signal results in the CAS/ signal no longer controlling the output buffer. By doing so, a pipelined data flow is provided allowing data to be read and processed faster. In general, the extended output is accomplished by configuring the DRAM, such as a FP mode DRAM, so that the CAS/ signal no longer tristates the I/O buffer when CAS/ goes into the precharge state. In the EDO DRAM, the data precharge time caused by the CAS/ signal does not exist thereby reducing the data fetch time and the operational cycle time of the device.

Accordingly, the EDO DRAM requires the data output hold time $t_{DOH}$, the data access time $t_{CPA}$, the EDO mode cycle time (hyper page cycle time) $t_{HPC}$, and the CAS/ signal precharge time $t_{CPA}$, in addition to the constraints imposed by the time parameters $t_{RAC}$, $t_{CAC}$, and $t_{AA}$. The data output hold time $t_{DOH}$ is defined as the data hold time after the CAS/ signal changes from a logic high to a logic low state. The access time $t_{CPA}$ is measured from the CAS/ signal precharge to the next data output. The hyper page cycle time $t_{HPC}$ is a complete period of the CAS/ signal. Finally, the CAS/ precharge time $t_{CP}$ is measured from a logic low to high transition of the CAS/ signal to a logic high to low transition of the CAS/ signal.

A high speed tester is required to functionally test the FP and EDO mode DRAM devices described above. However, high speed testers are expensive resulting in high equipment investment costs. Additionally, the technological advances of the test equipment do not track the rapid progress of the memory devices. Accordingly, it is desirable to test high speed memory devices using existing low speed test equipment thereby reducing the initial equipment investment and the time to market of newly developed DRAM devices.

The M9600 Memory Device Tester from MINATO of Japan is an example of a low speed tester. The M9600 tester has a maximum frequency of 33 MHZ (30 ns clock period) and a usable rate range from 30 ns to 4 ms. Thus, it is impossible to realize an EDO mode cycle time $t_{HPC}$ of 20 to 25 ns necessary to test 50 ns/60 ns 16M EDO DRAM. This problem is overcome by using a clock modulation technique disclosed in co-pending patent application Attorney Do. No. 9903-5, filed herewith, titled TEST METHOD OF INTEGRATED CIRCUIT DEVICES BY USING A DUAL EDGE CLOCK TECHNIQUE by the same assignee.

In the meantime, when a slow tester such as the M9600 tester is used to test FP and EDO mode DRAMs, the test cycle timing must be modified to avoid interferences between slower frequency tester signals and higher frequency Device Under Test (DUT) signals.

SUMMARY OF THE INVENTION

It is an object of the present invention to overcome the disadvantages associated with prior art test methods and circuits therefor.

It is another object of the present invention to overcome the timing limitations of low speed testers.

It is yet another object of the present invention to provide a test method by which high speed memory devices can be tested using relatively low speed testers.

It is yet another object of the present invention to establish timing conditions for a number of signals supplied from the low speed tester to the DUT.

According to the present invention, a shift signal and a strobe signal are generated from a tester. The shift signal controls a driver switch and a comparator switch, and the strobe signal enables a comparator. By supplying the shift signal within a predetermined time range, the usable range of the strobe signal, and thus of the tester, expands and new timing conditions for the clock signals in the test cycle can be obtained.

According to the timing conditions of the tester signals, the shift signal of a read operation in read-and-then-write sequence of operation must be equal to or less than the activation of the WE/ signal of the next cycle when the operational timing is a one-rate cycle condition in which the strobe signal is within the test cycle. In a write-and-thenread sequence of operations, the shift signal must begin at the same time or earlier than the activation of the OE/ signal of the next cycle.

When the operational timing is a two-rate cycle condition in which the strobe signal occurs outside of the test cycle, the maximum shift clock signal has to meet the condition of 'next test cycle—dead zone', and the minimum shift clock has to meet the condition of 'test cycle+shift clock≧strobe signal+dead zone' in consideration that the test cycle must larger than the strobe signal by over the dead zone in the one-rate cycle condition.

BRIEF DESCRIPTION OF THE DRAWINGS

The above objects and advantages of the present invention will become more apparent by describing in detail a preferred embodiment thereof with reference to the accompanying drawings in which.

DETAILED DESCRIPTION OF THE PREFERRED EMBODIMENT

Figure 1:
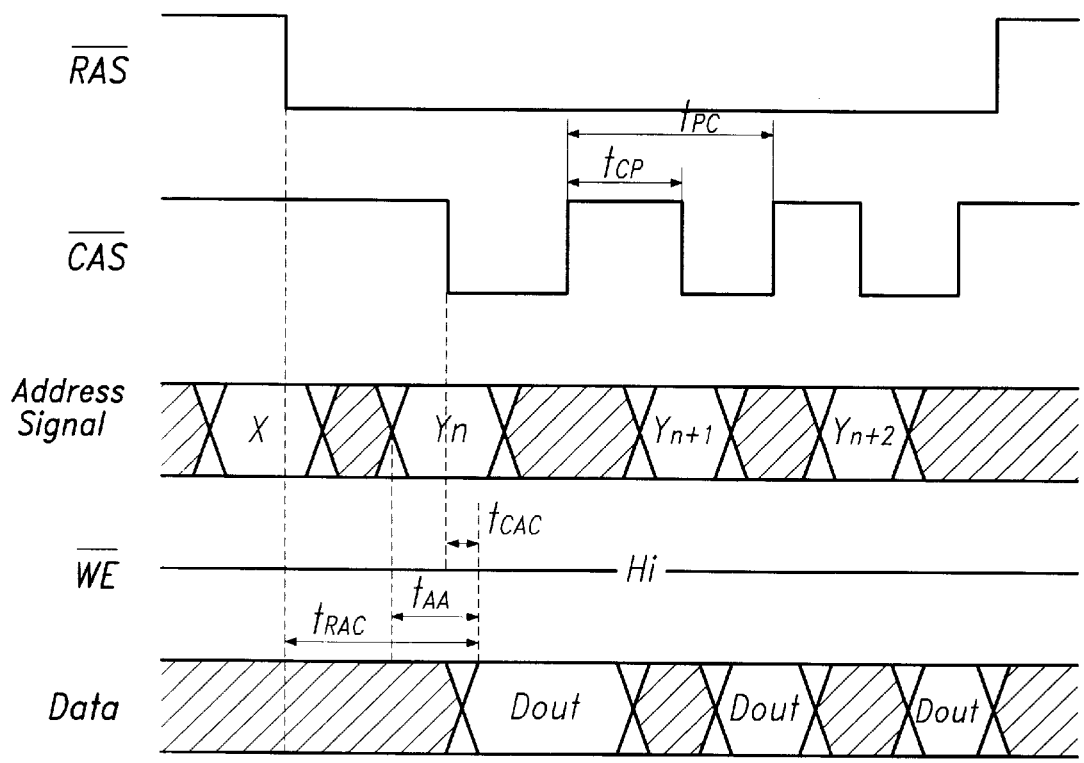
FIG. 1 is a timing diagram of a conventional DRAM operating in the FP mode.
Figure 2:
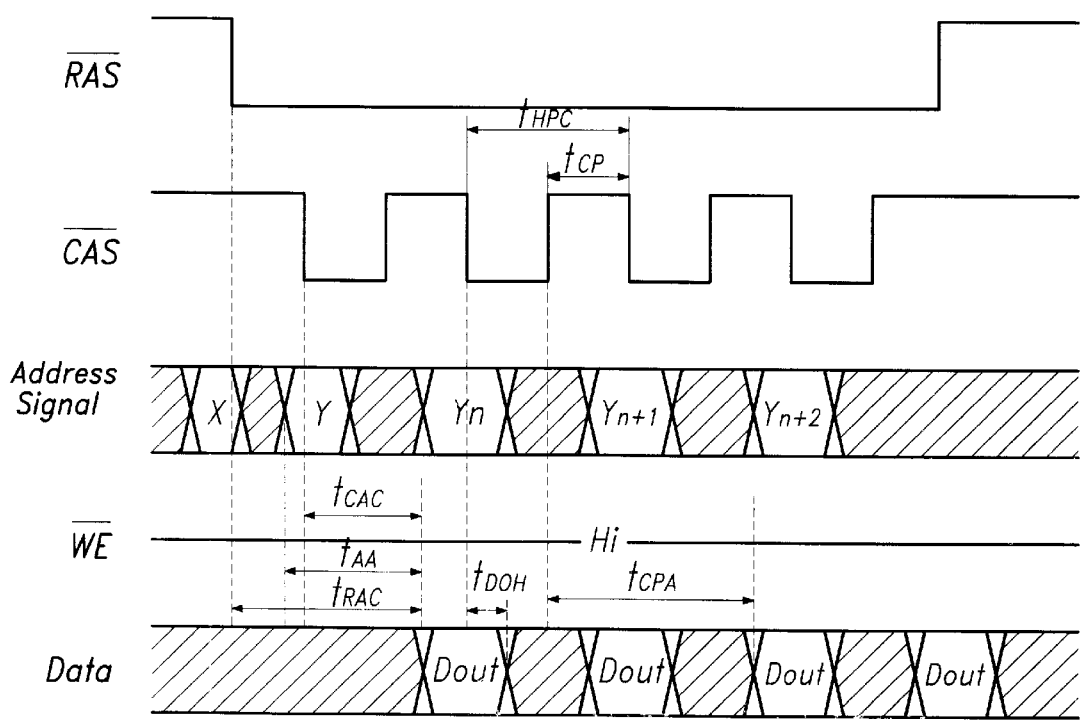
FIG. 2 is a timing diagram of a conventional DRAM operating in the EDO mode.
Figure 3:
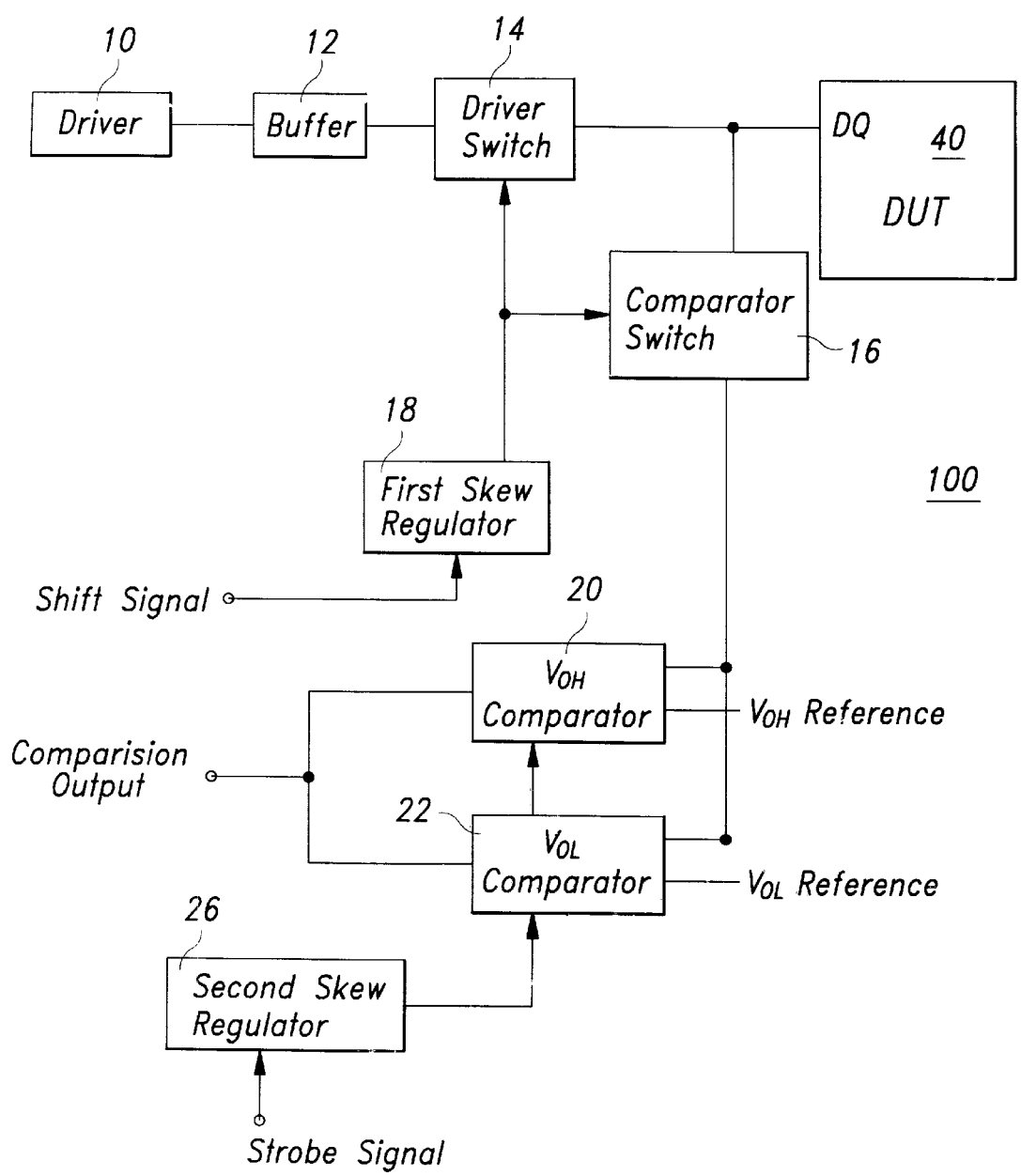
FIG. 3 is a block diagram of an I/O and driver circuit board for a low speed DRAM tester.

FIG. 3 is a block diagram of an I/O and driver circuit board for a low speed tester such as the M9600 tester previously mentioned. Generally, testers provide a plurality of signals to the DUT. For example, the M9600 tester provides a total of 10 signals to the DUT. The plurality of signals typically include a RAS/ signal, a CAS/ signal, a row address signal, a column address signal, a WE/ signal, an output enable OE/ signal, a strobe signal, a shift signal, and a tri-state signal, among others. The RAS/ and CAS/ signals control operations related to the row and column addresses, respectively. The WE/ and OE/ signals are used to determine whether the memory device is performing a read or a write operation. The strobe signal enables a comparator which compares data output from the memory device with predetermined reference data. The shift signal controls the connection of data input and output terminals on the memory device to the driver or the comparator on the tester. The tri-state signal drives the data output terminals of the memory device to a high impedance state that is neither a logic low (0) nor a logic high (1).

The tester system shown in FIG. 3 includes DUT 40 having data input and output terminals DQ coupled to both the driver 10 and the $V_{OH}$ and $V_{OL}$ comparators 20 and 22, respectively. DUT 40 is not limited to a single memory device under test. Rather, DUT 40 can be a single or a plurality of individual semiconductor memory devices under test. For simplicity, we will refer to DUT 40 in the singular. Comparators 20 and 22 are on the tester I/O and driver circuit board. During a write operation, DUT 40 receives input data via the driver 10, a buffer 12, and the driver switch 14. During a read operation, DUT 40 provides output data to the $V_{OH}$ comparator 20 and $V_{OL}$ comparator 22. At $V_{OH}$ comparator 20 and $V_{OL}$ comparator 22 output data is compared with the high reference voltage $V_{OH}$ and low reference voltage $V_{OL}$, respectively. The high reference voltage $V_{OH}$ is the minimum voltage that the memory device can recognize as a logic high state, i.e., a logic 1. The low reference voltage $V_{OL}$ corresponds to the maximum voltage that the memory device can recognize as a logic low state, i.e., a logic 0.

A first skew regulator 18 receives a shift signal generated externally by a signal generator (not shown). The first skew regulator 18 is a kind of latch buffer which synchronizes the shift signal with a system clock and provides a synchronized version of the shift signal to the driver switch 14 and the comparator switch 16. Similarly, a second skew regulator 26 receives a strobe signal generated externally by the signal generator. The second skew regulator 26, like the first skew regulator 18, is a kind of latch buffer which synchronizes the strobe signal with the system clock and provides a synchronized version of the strobe signal to the high reference voltage $V_{OH}$ comparator 20 and the low reference voltage $V_{OL}$ comparator 22.

The comparison made by the high and low reference voltage comparators $V_{OH}$ and $V_{OL}$ 20 and 22, respectively, is triggered by the synchronized version of the strobe signal output from the second skew regulator 26. Inevitably, a dead time zone exists where the strobe signal cannot be used due to the delivery delay time of the strobe signal from the signal generator to the second skew regulator 26 to the low reference voltage $V_{OL}$ comparator 22 or to the high reference voltage $V_{OH}$ comparator 20. For example, if the test cycle is reset within the dead zone, the strobe signal originating at the signal generator will not reach the comparator before a test cycle ends causing the DUT 40 to fail to output data. The dead zone is typically around 10 ns. In order to expand the usable range of the strobe signal, the shift signal is employed. As mentioned above, the shift signal is also generated by the signal generator (not shown) and provided to the first skew generator 18. The synchronized version of the shift signal controls opening and closing of the driver switch 14 and the comparator switch 16.

The usage of the shift signal is more tightly controlled as the frequency of the test cycle increases. If the shift signal deviates from a specified range, interferences between the control and clock signals provided by the tester can occur and hence an unintended test cycle timing parameters can be applied to the DUT 40.

Figure 4:
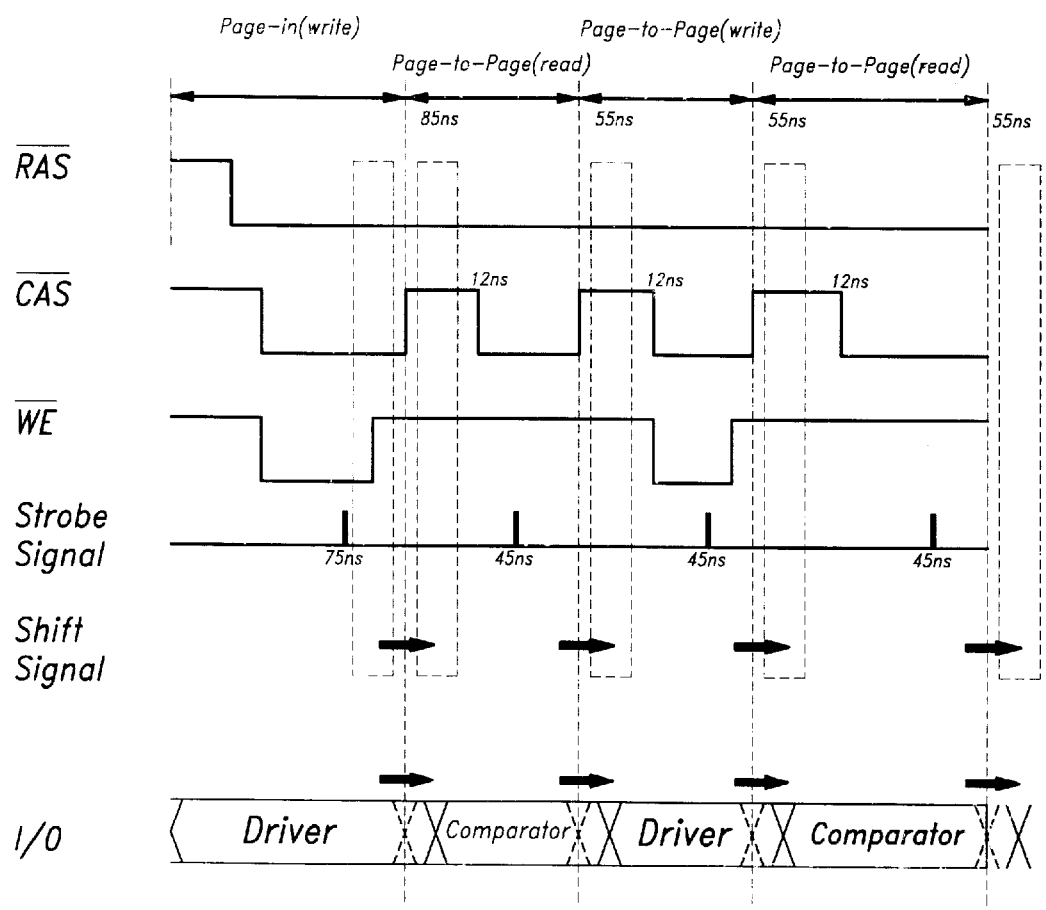
FIG. 4 is a timing diagram of an FP mode DRAM when the strobe signal is within the test cycle.

Timing conditions for the use of the strobe signal and the shift signal will be explained separately for FP and EDO DRAMs. FIG. 4 is a timing diagram of a FP mode DRAM when the strobe signal is within a test cycle. The FP mode DRAM as well as the EDO mode DRAM operates in a page unit defined by a valid row address at the falling edge of the RAS/ signal. One page includes the page-in cycle, at least one page-to-page cycle, and a page-out cycle (not shown). The page-in cycle is the first cycle of a page. The page-in cycle is measured from the time both the RAS/ and CAS/ signals are active (transition from a logic high to a logic low) to the time when the CAS/ signal is deactivated (transitions from a logic low to a logic high). The page-out cycle is the last cycle of a page. The page-out cycle is measured from the end of a page-to-page cycle to the time when both the RAS/ and the CAS/ signals are deactivated (transition from a logic low to a logic high). During the page-to-page cycle, the RAS/ signal remains active (at a logic low) and the CAS/ signal periodically alternates from an active to an inactive state (transitions from a logic low to a logic high and back to a logic low).

In the one-rate condition, the read and the write operations are repeated and the strobe signal must be generated to meet the following condition:

$$t_{STROBE\ SIGNAL} \leq T_{TEST\ CYCLE} - t_{DEAD\ ZONE}$$

This condition is necessary because of the delivery delay time of the strobe signal as mentioned above. For instance, if a tester generates a strobe signal at 45 ns for the page-to-page read operation shown in FIG. 4, the strobe signal will enable the $V_{OH}$ comparator 20 and/or $V_{OL}$ comparator 22 shown in FIG. 3 at 55 ns (assuming a 10 ns dead zone). Once the comparator is enabled, testing of the output data from the DUT 40 begins. However, CAS/ goes to its inactive high level at 55 ns as shown in FIG. 4. This transition of CAS/ resets the test cycle to a page-to-page write cycle from the previous page-to-page read cycle. The reset of the test cycle disables the comparator, ending output data comparisons. Accordingly, the strobe signal must be generated earlier than $T_{TEST\ CYCLE} - t_{DEAD\ ZONE}$.

As shown in FIG. 4, during subsequent read and write operations, the DUT 40 data input and output terminals DQ are connected to the I/O driver 10 and buffer 12 or to the comparators 20 and 22 responsive to the driver switch 14 or to the comparator switch 16. With the use of the shift signal, the DUT 40 data input and output terminals DQ are connected to the I/O driver 10 and buffer 12 or to the comparators 20 and 22 after the delivery delay time of the shift signal passes. As a result, if the shift signal of a read cycle is generated after the WE/ signal of the next write cycle is activated, the DUT 40 input and output terminals DQ are connected to the comparator at a time when the WE/ signal is enabled and thus the input data provided by the driver will not be delivered to the DUT 40.

Therefore, the shift signal of the read cycle in a read-to-write operation sequence must be generated at less than or equal to the activation time of the WE/ signal of the next cycle. Likewise, the shift signal of the write cycle in a write-to-read operation sequence must be generated at less than or equal to the activation time of the OE/ signal of the next cycle. The shift signal maintains a logic low state when disabled and a logic high state when enabled. The enabled shift signal controls the driver switch 14 and the comparator switch 16 such that the connection of the DUT 40 input and output terminals DQ to the driver switch 14 and the comparator switch 16 is delayed. For instance, if the shift signal is set to 5 ns in a write operation, the data input and output terminals DQ remain connected to the driver for 5 ns after the next cycle begins. Further, if the shift signal is set to 5 ns in a read operation, the data input and output terminals DQ remain connected to the comparators 20 and 22 after the next cycle begins.

On the other hand, the strobe signal plays no role during the write cycle in the test timing of FIG. 4. When the test timing is in the write cycle, an Algorithm Pattern Generator (ALPG), also called a Test Pattern Generator, contained in the tester, provides logic high state for the WE/ signal and the enabling and disabling point of the WE/ signal is determined by a Timing Generator (TG) contained in the tester. If the timing is a write cycle, the ALPG does not generate the strobe signal even though it is indicated in the test timing diagram.

Figure 5:
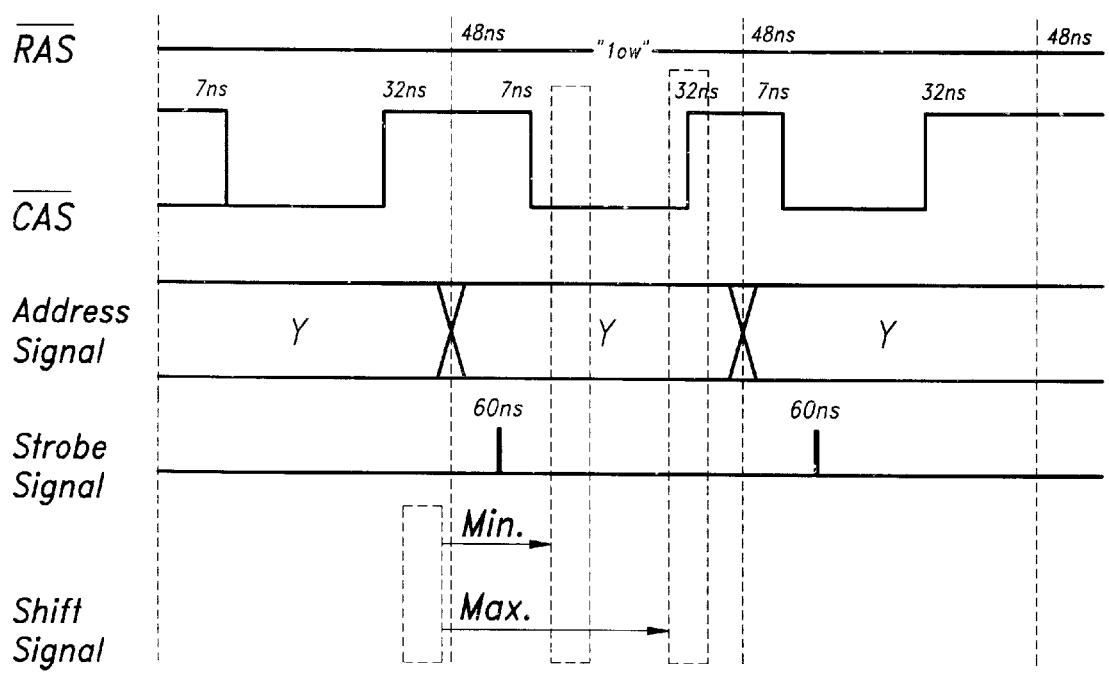
FIG. 5 is a timing diagram of an EDO mode DRAM when the strobe signal is outside of the test cycle.

FIG. 5 is a timing diagram of an EDO mode DRAM when the strobe signal is generated outside of a test cycle. In the EDO mode, data is reset when the next cycle RAS/ and CAS/ signal are enabled and not when the present cycle RAS/ and CAS/ are disabled. The data retention time after RAS/ and CAS/ of the next cycle are disabled is $t_{DOH}$. The data hold time of the device must be tested. During testing, the strobe signal has to move to the next cycle which requires new and tighter limit conditions to the strobe and shift signals as the test frequency increases. FIG. 5 is an example of the tighter limit conditions for an EDO DRAM where the test item is the data hold time $t_{DOH}$.

The maximum and minimum shift clock for moving the dead zone must meet the following timing conditions:

$$t_{MAX\ SHIFT\ SIGNAL} \leq T_{TEST\ CYCLE} - t_{DEAD\ ZONE}$$

$$T_{TEST\ CYCLE} + t_{MIN\ SHIFT\ SIGNAL} \geq t_{STROBE\ SIGNAL} + t_{DEAD\ ZONE}$$

Therefore, $$t_{STROBE\ SIGNAL} + t_{DEAD\ ZONE} - T_{TEST\ CYCLE} \leq t_{SHIFT\ SIGNAL} \leq T_{TEST\ CYCLE} - t_{DEAD\ ZONE}$$

Accordingly, when the test cycle is 48 ns long and the strobe signal is 60 ns as shown in FIG. 5, the shift signal must have the following maximum and the minimum condition (assuming $t_{DEAD\ ZONE}$=10 ns):

$$22\ ns \leq t_{SHIFT\ SIGNAL} \leq 38\ ns$$

Table 1 shows relevant test results using the timing conditions according to the present invention. To verify the test results, the results shown in Table 1 obtained by using the relatively slow M9600 tester with the timing conditions of the present invention were verified by using a high frequency tester (a tester having an operating frequency greater than that of the DUT) with conventional timing conditions.

TABLE 1

| | Test Results using M9600 and the timing parameters of the present invention | | |
|---|---|---|---|
| Actual failures | Speed Fail | $t_{RP}$ Margin Fail | EDO $t_{DOH}$ Fail |
| 74 | 20 | 46 | 8 |

Memory devices have also been tested using the X-9062 tester available from ADVAN. The X-9062 has a maximum operating frequency of 66 MHZ. Of a total of 3003 failed memory devices, 74 were selected which had a failure mode related to EDO test items. All 74 of the selected devices were re-tested using a M9600 tester and the timing conditions of the present invention. The test results shown in Table 1 reveal that of 74 failed devices, twenty devices failed due to speed, forty-six devices failed due to CAS/ before RAS/ (CBR) timing $t_{RP}$ margin failure, and eight devices failed due to true EDO $t_{DOH}$ problems.

Having described and illustrated the principles of the invention in a preferred embodiment thereof, it should be apparent that the invention can be modified in arrangement and detail without departing from such principles. I claim all modifications and variation coming within the spirit and scope of the following claims.

We claim:

1. A method for testing semiconductor memory devices using a tester, the tester generating row and column address signals for addressing storage locations of a memory device, a row address strobe (RAS) signal for controlling row address related operations of the memory device, a column address strobe (CAS) signal for controlling column address related operations of the memory device, a write enable (WE) signal and an output enable (OE) signal for controlling read and write operations of the memory device, a strobe signal, and a shift signal, the tester comprising a driver unit for providing input data to the memory device, a comparator for comparing output data from the memory device with reference values responsive to the strobe signal, a driver switch connected between the driver unit and the memory device responsive to the shift signal, and a comparator switch connected between the comparator and the memory device responsive to the shift signal, the test method comprising:

applying the strobe signal to the comparator, the strobe signal having a usable time zone and a dead time zone, the strobe signal being incapable of use during the dead time zone due to a delay time between the strobe signal being generated by a signal generator and the strobe signal arriving at the comparator from the signal generator; and applying a shift signal to the driver switch and the comparator switch, the shift signal having a timing limitation that maximizes the usable time zone of the strobe signal.

2. The method according to claim 1 wherein the memory device operates in a page unit, the page unit comprising a page-in cycle in which the RAS and the CAS signal are in an active state, at least one page-to-page cycle in which the RAS signal is in the active state and the CAS signal toggles between the active state and an inactive state, and a page-out cycle in which the RAS and the CAS signal are in the inactive state and wherein applying the strobe signal includes generating the strobe signal on or before each test cycle time subtracted by the dead time zone.

3. The method according to claim 2 wherein the test cycle includes repeated read-to-write operations and wherein applying the shift signal includes generating the shift signal on or before the WE signal changes from an inactive state to an active state in a subsequent write operation.

4. The method according to claim 2 wherein the test cycle includes repeated write-to-read operations and wherein applying the shift signal includes generating the shift signal on or before the OE signal changes from an inactive state to an active state in a subsequent read operation.

5. The method according to claim 2 including enabling the comparator with a rising edge of the CAS signal.

6. The method according to claim 1 wherein the memory device operates in a page unit, the page unit comprising a page-in cycle in which the RAS and the CAS signal are in an active state, at least one page-to-page cycle in which the RAS signal is in the active state and the CAS signal toggles between the active state and an inactive state, and a page-out cycle in which the RAS and the CAS signal are in the inactive state and wherein applying the shift signal includes:

generating the shift signal on or before a maximum time; and generating the shift signal on or after a minimum time.

7. The method according to claim 6 wherein generating the shift signal on or before a maximum time includes generating the shift signal on or before a test cycle time subtracted by the dead time zone.

8. The method according to claim 6 wherein generating the shift signal on or after the minimum time includes generating the shift signal on or after a strobe signal generation time added to the dead time zone subtracted by a test cycle time.

9. The method according to claim 6 wherein the memory device operates in an extended data out mode.

10. A tester for testing a semiconductor memory device, comprising:

a driver unit for providing input data to the memory device;

a driver switch connected between the driver unit and the memory device responsive to a shift signal;

a comparator for comparing output data from the memory device with predetermined reference values responsive to a strobe signal; and a comparator switch coupled between the comparator and the memory device responsive to the shift signal for coupling the comparator to the memory device;

wherein the strobe signal includes a dead zone where the strobe signal cannot be used due to a delay time between the strobe signal being generated by a signal generator and the strobe signal arriving at the comparator from the signal generator; and wherein the shift signal includes a timing limitation that minimizes the dead zone of the strobe signal.

11. A tester according to claim 10 including a buffer coupled between the driver unit and the driver switch for buffering the input data from the driver unit.

12. A tester according to claim 10 including:

a first skew regulator coupled to the comparator switch and the driver switch for receiving the shift signal generated by the signal generator and synchronizing the shift signal with a system clock; and a second skew regulator coupled to the comparator for receiving the strobe signal generated by the signal generator and synchronizing the strobe signal with the system clock.

13. A tester according to claim 10 wherein the comparator includes:

a low reference voltage comparator for comparing the output data from the memory device to a low reference voltage; and a high reference voltage comparator for comparing the output data from the memory device to a high reference voltage.

14. A tester according to claim 10 wherein the timing limitation of the shift signal is equal to a test cycle period minus the dead zone.

15. A tester according to claim 10 wherein the strobe signal is generated on or before each test cycle period minus the dead zone.

16. A tester according to claim 15 wherein the test cycle includes repeated read-to-write operations and wherein the shift signal is generated on or before a write enable signal changes from an inactive state to an active state in a subsequent write operation.

17. A tester according to claim 15 wherein the test cycle includes repeated write-to-read operations and wherein the shift signal is generated on or before an output enable signal changes from an inactive state to an active state in a subsequent read operation.

18. A tester according to claim 10 wherein the shift signal is generated on or before a maximum time and on or after a minimum time.

19. A tester according to claim 18 wherein the maximum time is equal to a test cycle period minus the dead zone.

20. A tester according to claim 19 wherein the minimum time is equal to a strobe signal generation time plus the dead zone minus the test cycle period.

* * * * *